United States Patent [19]

Takahashi

[11] 4,435,697
[45] Mar. 6, 1984

[54] ANALOG-DIGITAL CONVERTER

[75] Inventor: Yukiharu Takahashi, Yokohama, Japan

[73] Assignee: Tokyo Shibaura Electric, Japan

[21] Appl. No.: 407,101

[22] Filed: Aug. 11, 1982

Related U.S. Application Data

[60] Division of Ser. No. 135,662, Mar. 31, 1980, which is a continuation of Ser. No. 855,785, Mar. 10, 1978.

[30] Foreign Application Priority Data

Mar. 12, 1977 [JP] Japan ................................. 52-27470
Mar. 12, 1977 [JP] Japan ................................. 52-27471

[51] Int. Cl.$^3$ .......................................... H03K 13/20
[52] U.S. Cl. ...................... 340/347 AD; 340/347 NT
[58] Field of Search ................. 340/347 AD, 347 NT; 324/99 D; 318/603

[56] References Cited

U.S. PATENT DOCUMENTS 3,633,202  1/1972  Kuckein .................... 340/347 AD Primary Examiner—C. D. Miller
Attorney, Agent, or Firm—Finnegan, Henderson, Farabow, Garrett & Dunner

[57] ABSTRACT

An analog-digital converter designed to provide digital data by converting analog input voltage signals into pulse signals by a voltage-frequency converter, and counting said pulse signals by a counter, the improvement being that the A-D converter comprises a sequence controller which selectively supplies low level- or high level- input voltage signals to the A-D converter before analog input signals being measured are received therein.

3 Claims, 18 Drawing Figures

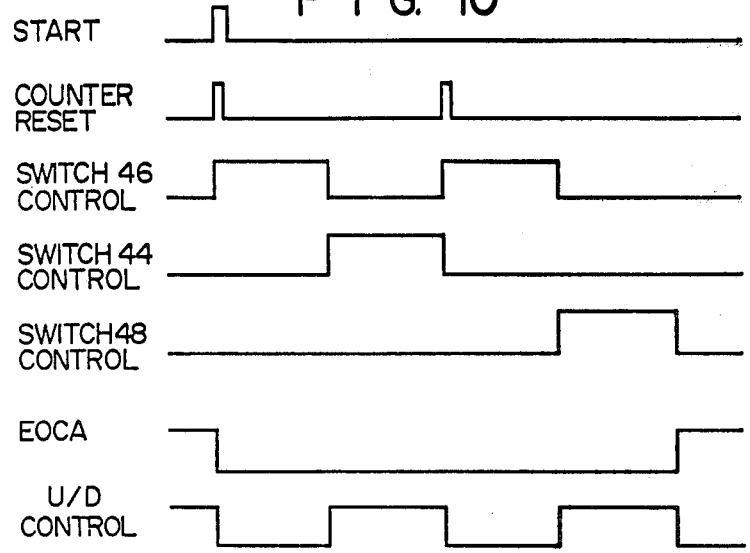
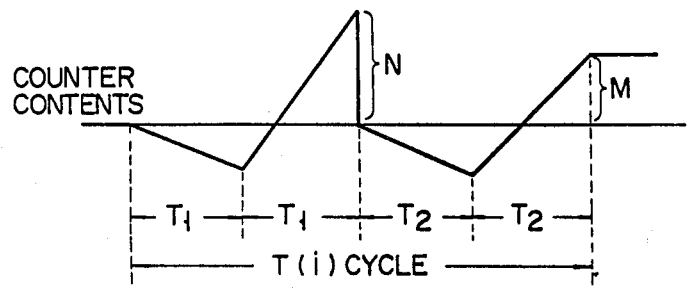
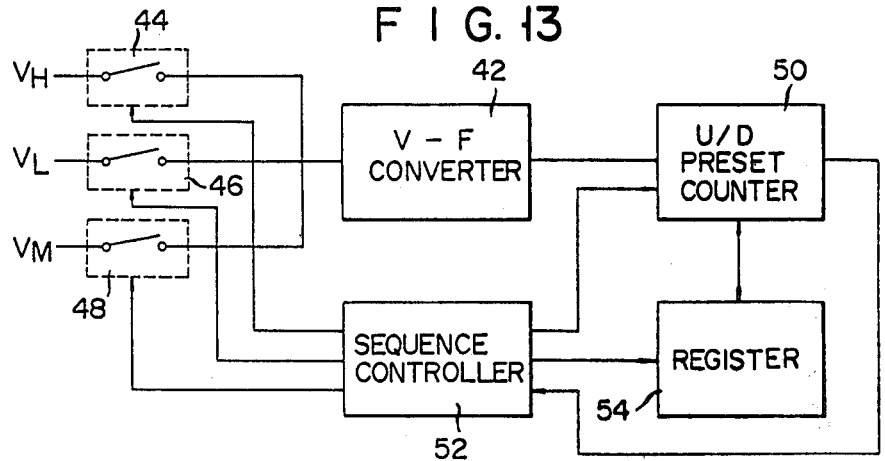

F I G. 14
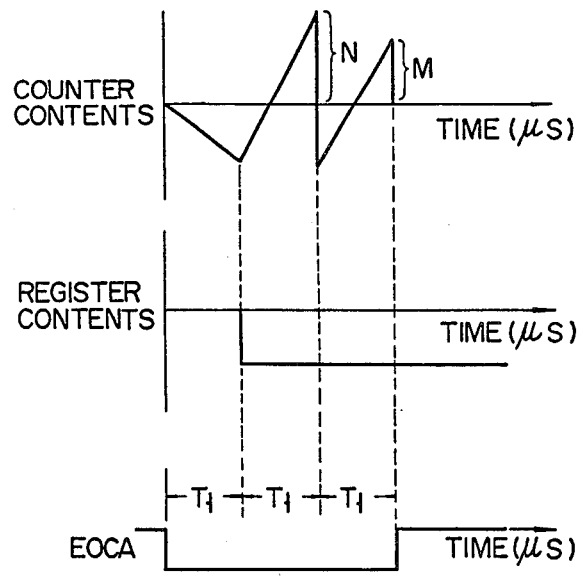
F I G. 15
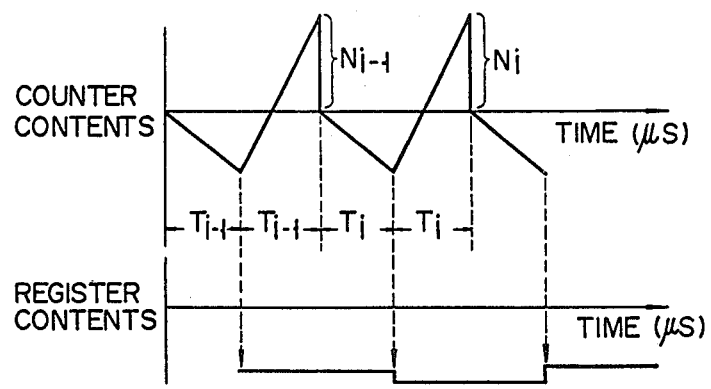

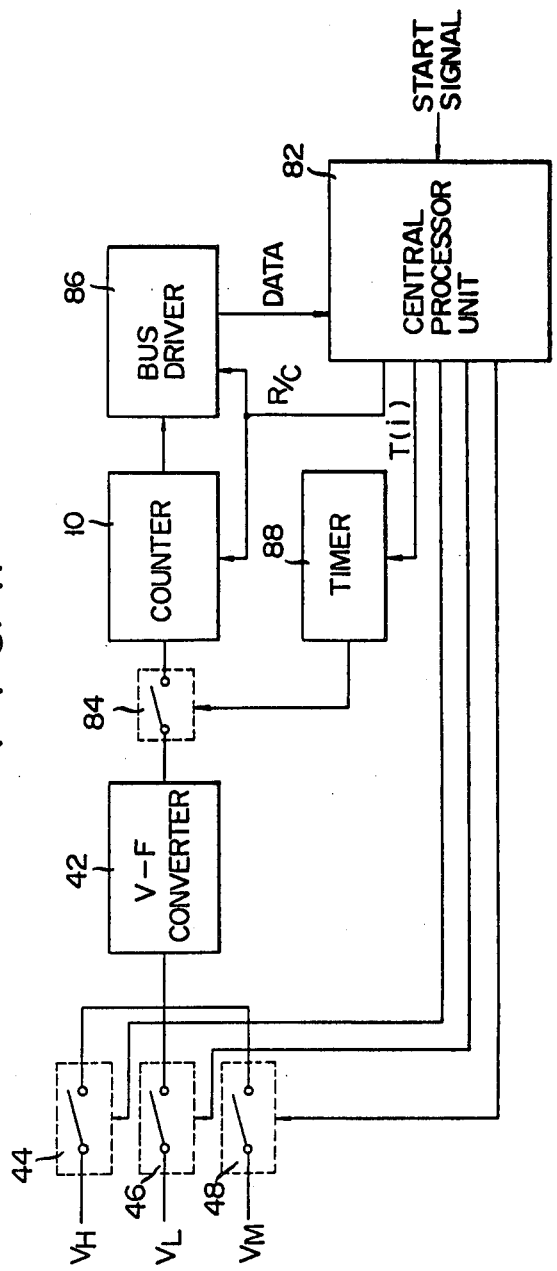
F I G. 17

ANALOG-DIGITAL CONVERTER

This application is a division of Ser. No. 135,662, filed Mar. 31, 1980, which is a continuation of Ser. No. 855,785, filed Mar. 10, 1978.

This invention relates to an analog-digital converter (hereinafter referred to as "an A-D converter") for converting analog input signals into digital signals by means of a voltage-frequency converter (hereinafter referred to as "a V-F converter") and also to a method of said A-D conversion.

With the conventional A-D converter, analog input voltage signals are converted into digital signals by being supplied to the V-F converter, generating pulse signals in a number proportional to said analog input voltage, and counting said pulse signals by a counter. However, the above-mentioned known A-D converter has the drawback of giving rise to errors in measurement, unless the voltage-frequency characteristic (hereinafter referred to as "V-F characteristic") of the V-F converter is the type which is expressed by a curve A passing through the zero point or a referential point as shown in FIG. 1 and whose inclination is little affected by changes in ambient temperature or power source voltage. If, however, the V-F characteristic curve has to pass the zero point or a referential point with its graduation substantially fixed regardless of any external factor, then the V-F converter will have a complicated circuit arrangement and increase in cost. Actually, however, the V-F characteristic curve generally tends to be affected by changes in ambient temperature or power source voltage. Therefore, the V-F characteristic curves such as curves B, C will have different graduations from the optimum curve A, though passing through the zero point. Or the V-F characteristic curves will not pass through the zero point at all like curves D, E. These events also lead to errors in measuring the V-F characteristic. Though it is necessary to provide a compensation circuit for resolution of the above-mentioned problems, yet this arrangement will render the A-D converter more expensive.

An object of this invention is to provide an A-D converter using a V-F converter which can provide error-free converted data.

Another object of the invention is to provide an A-D converter using a V-F converter which can determine error-free converted data, even when the V-F characteristic curves of the V-F converter do not pass through a referential point.

A still another object of the invention is to provide an A-D converter using a V-F converter which can furnish error-free converted data, even when the graduations of the V-F characteristic curves deviate from the prescribed plane.

A further object of the invention is to provide an inexpensive A-D converter using a V-F converter which can furnish error-free converted data even when the V-F converter varies in graduation with changes in external factors such as ambient temperature and power source voltage.

A further object of the invention is to provide a method of A-D conversion using a V-F converter which can provide error-free converted data, even when the V-F characteristic curves of the V-F converter do not pass through a referential point.

A further object of the invention is to provide a method of A-D conversion using a V-F converter which can furnish error-free converted data, even when the graduations of the V-F characteristic curves deviate from the prescribed plane.

A further object of the invention is to provide a method of A-D conversion using a V-F converter which can furnish error-free converted data even when the V-F characteristic curves of the V-F converter vary in graduation with changes in external factors such as ambient temperature and power source voltage.

According to an aspect of this invention, there is provided an A-D converter designed to obtain digital data by converting analog input voltage signals into pulse signals by a voltage-frequency converter, and counting said pulse signals by a counter, the improvement being that the A-D converter comprises a sequence controller which selectively supplies to the A-D converter a referential input voltage signal and an analog input signal being measured.

According to another aspect of this invention, there is provided an A-D conversion method using a V-F converter which comprises a step of supplying a referential input voltage signal and a step for supplying an analog input voltage signal being measured.

According to still another aspect of this invention, there is provided an A-D conversion method using a V-F converter which comprises a step of supplying a first referential input voltage signal for defining a referential point on the V-F characteristic curve of the V-F converter, a step of supplying a second referential input voltage signal for determining the graduation of the V-F characteristic curve and a step of supplying an analog input voltage signal being measured.

This invention can be more fully understood from the following detailed description when taken in conjunction with the accompanying drawings, in which:

FIG. 10 shows signal waveforms at various points of the block circuit diagram of FIG. 6 and the contents of a counter included therein;

Figure 11:
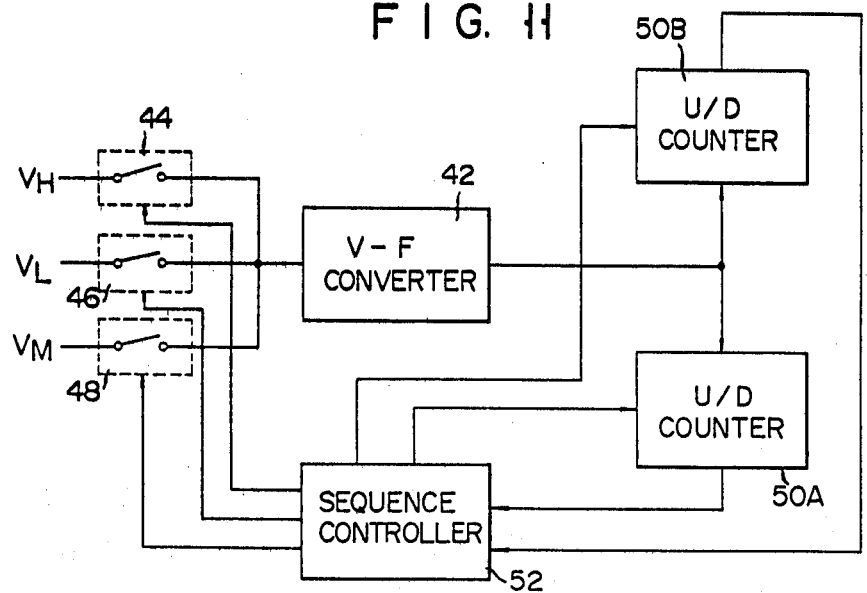
FIG. 11 is a block circuit diagram of an analog-digital converter according to still another embodiment of the invention.
Figure 12:
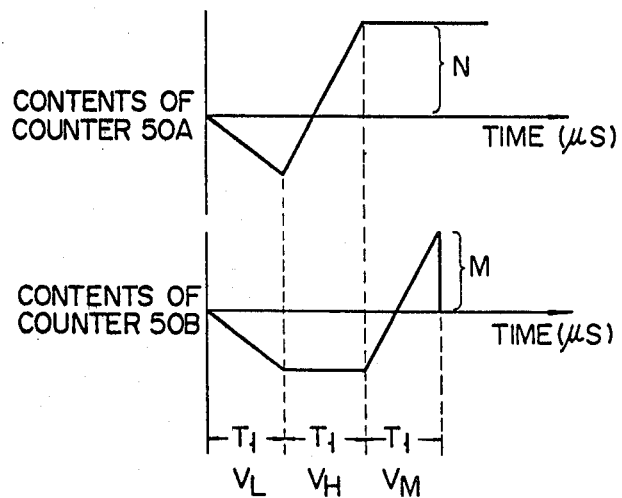
Figure 16:
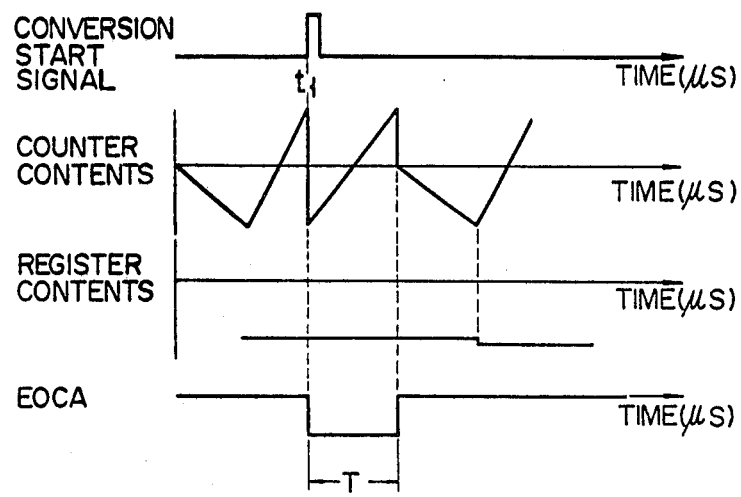
Figure 18:
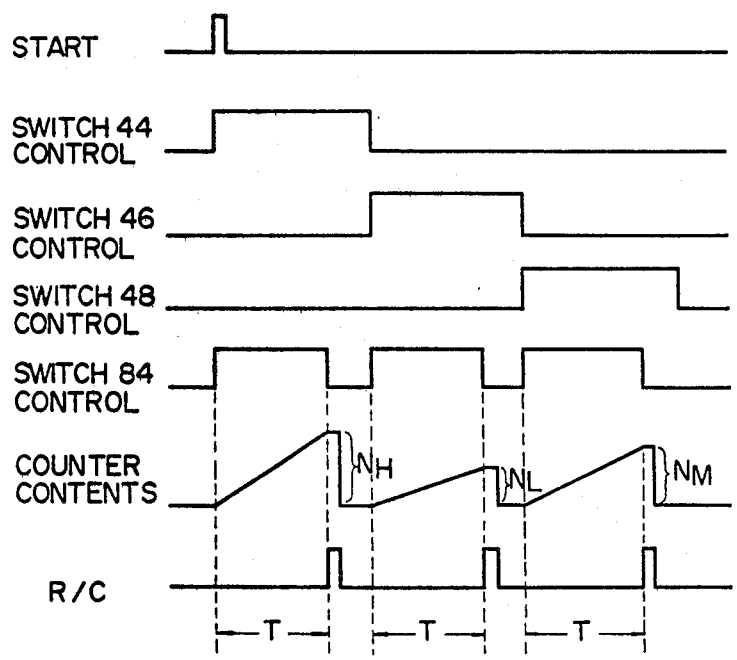

FIG. 12 indicates the contents of a counter included in the A-D converter of FIG. 11;

FIG. 13 is a block circuit diagram of an analog-digital converter according to a further embodiment of the invention;

FIG. 14 shows the contents of a counter included in the A-D converter of FIG. 13 according to a first counting operation;

FIGS. 15 and 16 set forth the forms of the contents of a counter included in the A-D converter of FIG. 13 according to a second counting operation;

FIG. 17 is a block circuit diagram of an analog digital converter according to a still further embodiment of the invention; and FIG. 18 shows signal waveforms at various points of the block circuit diagram of FIG. 17 and the contents of a counter included therein.

There will now be described by reference to FIG. 2 an analog-digital converter according to one embodiment of this invention. Referential numeral 2 denotes an operational amplifier. The positive (+) input terminal of this amplifier 2 is connected to a high voltage source having a high level $V_H$ through a switch 4 and also to an analog voltage source having a medium level $V_M$ through a switch 6. The negative (−) input terminal of the amplifier 2 is connected to a referential voltage source having a low level $V_L$. The output terminal of the amplifier 2 is connected to a V-F converter 8 whose output terminal is connected to one input terminal of an AND circuit 9. The output terminal of the AND circuit 9 is connected to a counter 10.

The output terminal of this counter 10 is used for the withdrawal of digital signals converted from analog signals. A sequence controller 12 generates a control signal which alternately renders the switches 4, 6 conducting and nonconducting.

Figure 3:
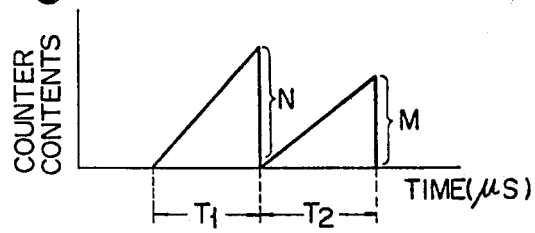
FIG. 3 illustrates the contents of a counter included in the A-D converter of FIG. 2.

There will now be described by reference to FIG. 3 the A-D conversion operation of the A-D converter arranged as described above. First, the switch 4 is closed by a switch control signal delivered from the sequence controller 12. The positive (+) input terminal of the amplifier 2 is supplied with a high level voltage signal $V_H$ through the switch 4. The negative (−) input terminal of said sequence controller 12 receives a low level voltage signal $V_L$. The amplifier 2 amplifies a difference between the voltage levels of both high-voltage and low-voltage input signals and generates an output voltage signal expressed as $V_H - V_L$. This voltage signal is converted by the V-F converter 8 into pulse signals having a frequency corresponding to a value of said differential voltage.

Pulse signals issued from the V-F converter 8 are supplied to the AND circuit 9. The AND circuit 9 produces logic product pulse signals from the pulse signals generated by the V-F converter 8 and from the EOCA (End of conversion) signals. The logic product pulse signals from the AND circuit 9 are counted by the counter 10. The contents of the counter 10 or the number of logic product pulse signals counted thereby indicate a value N or a certain length of time $T_1$ after the switch 4 is rendered conducting by a switch control signal supplied from the sequence controller 12.

After lapse of said time $T_1$, a switch control signal ceases to be delivered to the switch 4 from the sequence controller 12. Instead, said sequence controller 12 now supplies a switch control signal to the switch 6 to render it operative. At this time, the sequence controller 12 sends forth a counter control signal to clear the contents of the counter 10. Accordingly, the amplifier 2 receives an analog input voltage signal $V_M$ being measured and a low level referential input voltage signal $V_L$. Upon receipt of the two input signals, the amplifier 2 produces a differential voltage signal $V_M - V_L$. This differential voltage signal $V_M - V_L$ is converted by the V-F converter 8 into pulse signals having a frequency corresponding to the value of said differential voltage $V_M - V_L$. The pulse signals thus issued are counted by the counter 10. The contents of the counter 10 or the number of pulse signals counted thereby indicate a value M or a certain length of time $T_2$ after the switch 6 is rendered conducting. In this case, converted data Da is determined by the following equation:

$$Da = \frac{V_M - V_L}{V_H - V_L} \times (2^n - 1) = \frac{M}{N} \times (2^n - 1) \quad (1)$$

Referring to the above equation, n denotes a number of bits which should be converted. The term $(2^n - 1)$ represents the full scale count value of the converted data Da. However, the term $(2^n - 1)$ need not be limited to this value, but may be taken to denote any other optional referential value. Assuming $T_1 = T_2$ and $N = (2^n - 1)$, the aforesaid equation may be rewritten as follows:

$$Da = M$$

Namely, the number M of pulse signals counted by the counter 10 denotes required converted data Da.

Figure 1:
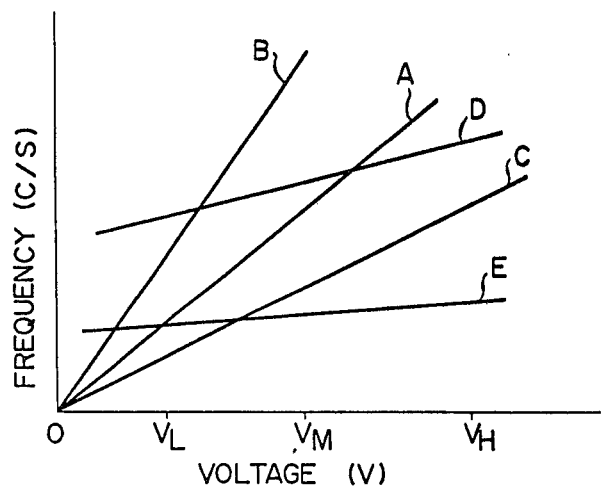
FIG. 1 is a curve diagram showing the voltage-frequency characteristic of a voltage-frequency converter.

The A-D converter according to the above-mentioned embodiment, can provide error-free converted data Da, although the V-F characteristic may vary with ambient temperature and power source voltage as indicated by the curve A, B, C of FIG. 1, provided these curves are straight ones passing through the zero point or referential point.

Figure 4:
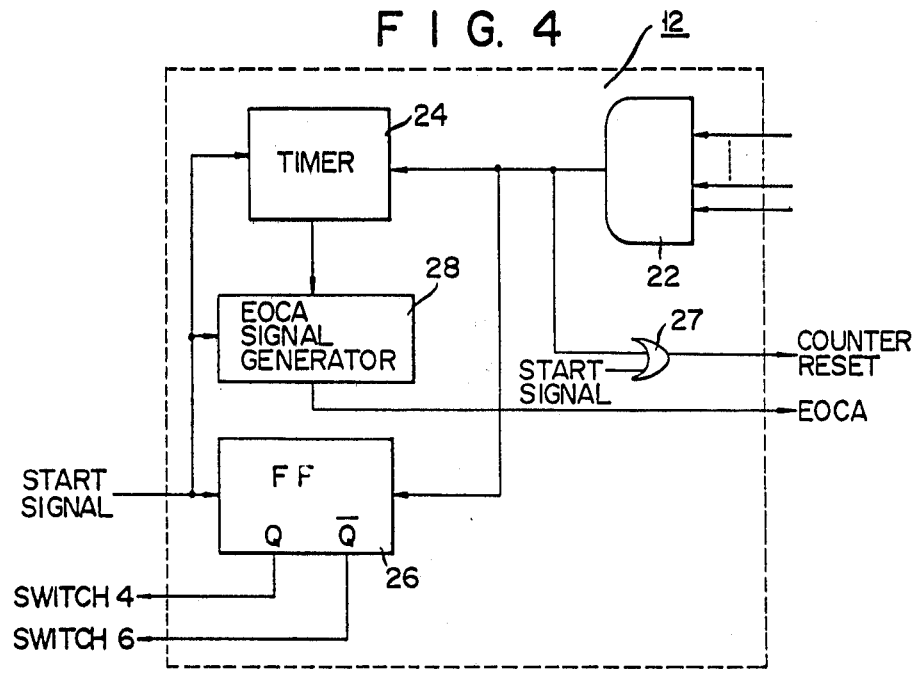
FIG. 4 is a block circuit diagram of a sequence controller included in the A-D converter of FIG. 2.

FIG. 4 is a block circuit diagram of the sequence controller 12 undertaking such control as leads to $T_1 = T_2$ and counted data $N = 2^n - 1$. An AND circuit 22 provides the logic product of all the bits issued from the counter 10. Where the binary mode of all the bits is "1" then the AND circuit 22 issues an output represented by a binary code "1". The output terminal of the AND circuit 22 is connected to a timer 24, which measures a length of time required for all the bits supplied from the counter 10 to be converted into a binary mode "1" when a voltage signal $V_H - V_L$ is received. The output terminal of the AND circuit 22 is also connected to a flip-flop circuit (hereinafter referred to as "FF") 26. An output signal from said AND circuit 22 reverses the binary mode of the FF 26. The output signal from the AND circuit 22 is also applied to one input terminal of an OR circuit 27. The other terminal of the OR circuit is supplied with the EOCA signal. The OR circuit 27 produces an output signal to clear the contents of the counter 10. The timer 24 is connected to an EOCA (End of conversion) signal generator 28, which sends forth a signal EOCA denoting the end of A-D conversion after a prescribed length of time preset in the timer 24. The timer 24 and FF 26 are also supplied with a start signal when the sequence controller 12 is to be put into operation.

Now let it be assumed that a start signal is received to render the sequence controller 12 operative. The start signal is supplied to the timer 24 and FF 26. As the timer 24 counts up a length of time, the FF 26 is set at a certain condition. At this time, let it be assumed that the Q terminal of the FF 26 produces an output having a binary code "1", and the $\overline{Q}$ terminal thereof sends forth an output having a binary code "0". Then the switch 4 is rendered conducting, causing high voltage $V_H$ to be impressed on the positive terminal of the amplifier 2. Since the negative terminal of the amplifier 2 is already supplied with low voltage $V_L$, the amplifier 2 generates an output voltage signal $V_H - V_L$. This differential voltage $V_H - V_L$ is converted by the V-F converter 8 into pulse signals having a frequency corresponding to said differential voltage $V_H - V_L$. The pulse signals thus issued are counted by the counter 10. The AND circuit 22 provides, as previously described, the logic product of the referential converted bits supplied from the counter 10, for example, all the converted bits ($2^n - 1$). Where, therefore, the counter 10 carries out counting up to the capacity, namely, makes a full scale count, then the AND circuit 22 delivers an output signal to the timer 24, which in turn is set at a time $T_1$ required for the contents of the converter 10 to indicate $N = (2^n - 1)$. An output signal from the AND circuit 22 is also conducted through the OR circuit 27 to the reset terminal of the counter 10 to clear its contents. Said output signal is further supplied to the FF 26 to reverse its binary mode. As the result, a switch to be operated is changed over from the unit 4 to the unit 6, causing the counter 10 to count pulse signals representing a differential voltage $V_M - V_L$. A time of counting is counted by the timer 24. After lapse of a prescribed length of time $T_2$, namely, a length of time $T_1$ at which the timer 24 is already preset, counting by the counter 10 is brought to an end. The contents M of the counter 10 obtained at this time denote required converted data. When detecting the completion of the above-mentioned counting, the control circuit 28 sends forth a conversion completion signal EOCA (End of conversion).

In the foregoing description, the time $T_2$ was controlled to be equal to the time $T_1$. With the time $T_1$ fixed, however, the time $T_2$ may be so controlled as to have a value expressed by the following equation relative to the time $T_1$:

$$T_2 = T_1 \times \frac{2^n - 1}{N} \quad (2)$$

In this case, converted data Da is determined by the following equation:

$$Da = \frac{M}{\frac{T_1 \times \frac{2^n - 1}{N}}{T_1}} \times (2^n - 1) = M \quad (3)$$

Irregularities in the control by which the lengths of time $T_1$, $T_2$ are made equal to each other lead to a decline in the precision of A-D conversion. In contrast, the control by which the length of time $T_2$ is made to have a value expressed by the equation (2) relative to the length of time $T_1$ eliminates the necessity of rendering both lengths of time $T_1$, $T_2$ equal to each other, thus offering the advantage of elevating the precision of A-D conversion.

The foregoing description regarded the A-D conversion to be always carried out by the sequential operation of a $T_1$ cycle and a $T_2$ cycle. However, if the $T_1$ cycle is carried out in advance, the A-D conversion can be effected with high precision simply by undertaking the $T_2$ cycle with respect to various input voltage signals being measured. In the abovementioned embodiment, the cycle of counting a value $V_H - V_L$ preceded the cycle of counting a value $V_M - V_L$. Even reversal of this cycle order gives the same desired result.

Figure 2:
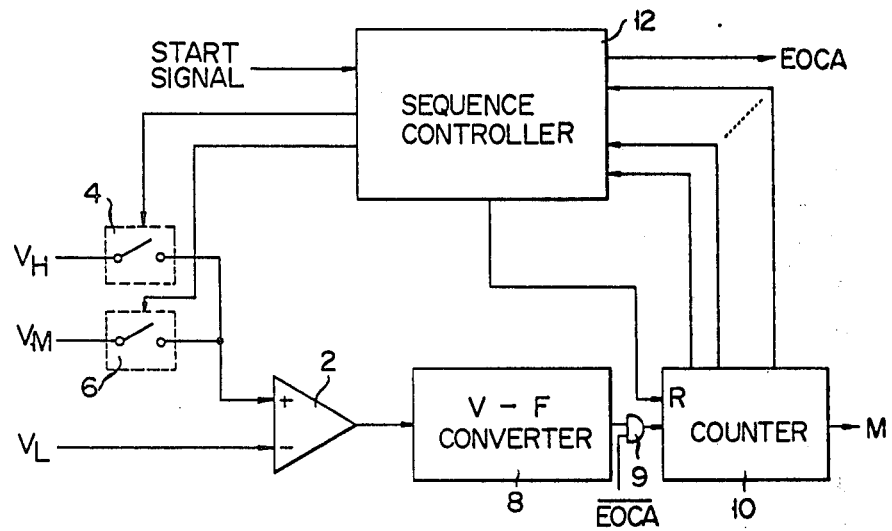
FIG. 2 is a block circuit diagram of an analog-digital converter according to one embodiment of this invention.
Figure 5:
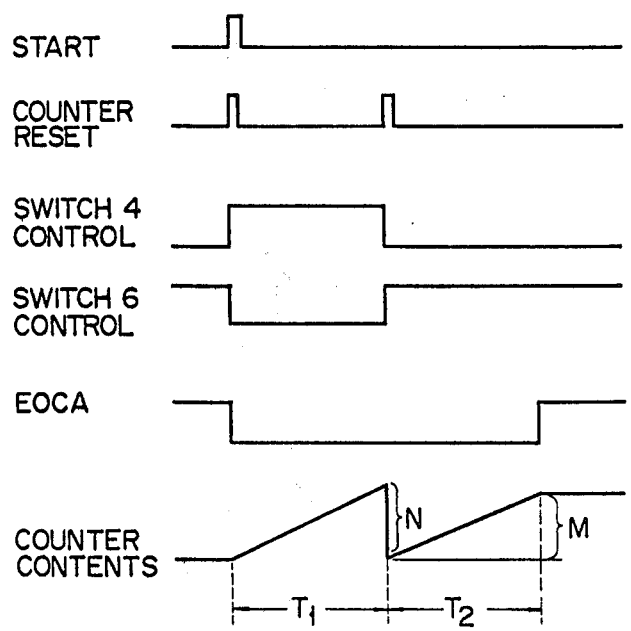
FIG. 5 shows signal waveforms at various points of the block circuit diagram of FIG. 2 and the contents of a counter included therein.

FIG. 5 shows signal waveforms at various points of the A-D converter of FIG. 2 and the contents of the counter 10 included therein.

There will now be described by reference to FIG. 6 the arrangement of an A-D converter according to another embodiment of this invention. The V-F converter 42 is selectively supplied with a high level referential input voltage signal $V_H$ through a switch 44 or a low level referential input voltage signal $V_L$ through a switch 46 or a voltage signal $V_M$ being measured through a switch 48. The output terminal of the V-F converter 42 is connected to an up-down counter 50. This up-down counter 50 is selectively set for up-counting or down-counting by a sequence controller 52, which also clears the contents of said up-down counter 50 and controls the selective operation of the switches 44, 46, 48.

There will now be described the operation of the A-D converter of FIG. 6 by reference to the counter contents of FIG. 7.

Now let it be assumed that the switch 46 remains closed for a time $T_1$ by a switch control signal supplied from the sequence controller 52, and that the up-down counter 50 is arranged for a down-counting mode by a counting mode-specifying signal delivered from the sequence controller 52. Then a low level voltage signal $V_L$ is conducted to the V-F converter to be converted into pulse signals. These pulse signals are counted by the up-down counter 50. In this case, the up-down counter 50 which is already preset for down-counting, has its contents decreased one by one, each time a pulse signal is received. After a time $T_1$, the contents of the up-down counter 50 indicate $(-F_L \times T_1)$ ($F_L$ denotes the frequency of an output pulse signal from the V-F converter when supplied with a low level referential voltage signal $V_L$).

Figure 8:
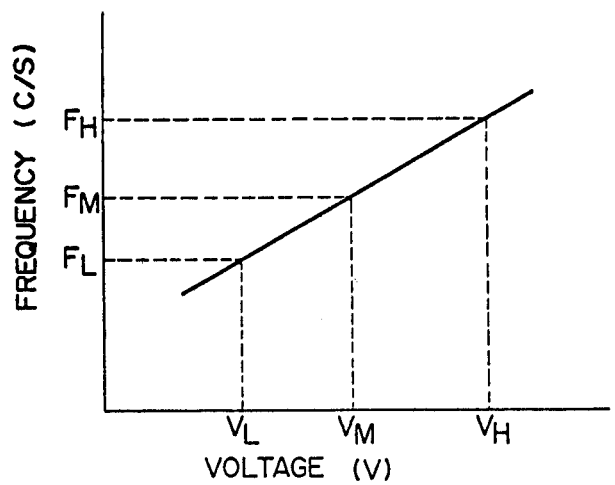
FIG. 8 shows the frequency-voltage characteristic curve of a general voltage-frequency converter.

When the switch 46 is rendered nonconducting by the sequence controller 52, the switch 44 is operated for a time $T_1$, and the up-down counter 50 is set for an up-counting mode. The V-F converter 42 issues pulse signals having a frequency corresponding to a high level referential voltage signal $V_H$. The up-down counter 50 now arranged for up-counting counts up these pulse signals. After a time $T_1$, the contents of the up-down counter 50 indicate $(F_H - F_L) \times T_1 = N$ ($F_H$ shows the frequency of an output pulse signal from the V-F converter when supplied with a high level referential voltage signal $V_H$). When the switch 44 is rendered nonconducting by the sequence controller 52, the switch 46 is operated for a time $T_2$ assuming $T_1 = T_2$ in this embodiment). The up-down counter 50 has its contents cleared and is specified for down-counting. After a time $T_2$, the contents of the up-down counter 50 indicate $(-F_L \times T_2)$. When the switch 46 is rendered nonconducting by the sequence controller 52, the switch 48 is put into operation, and the up-down counter 50 is set forth an up-counting mode. After a time $T_2$, the contents of the up-down counter 50 show $(F_M - F_L)T_2 = M$ ($F_M$ denotes the frequency of an output pulse signal from the V-F converter 42 when supplied with a voltage signal $V_M$ being measured). In this case, converted data Da is determined by the following equation:

$$Da = \frac{V_M - V_L}{V_H - V_L} \times (2^n - 1) \quad (4)$$

where:
n = a number of bits which should be converted
$(2^n - 1)$ = a maximum value indicated by the up-down counter 50 when the switch 44 is closed However, $(2^n - 1)$ need not be limited to the above-mentioned value, but may be taken to denote any other optional referential value. The value $V_H - V_L$ has a proportional relationship to the value $F_H - F_L$ as understood from the curve of FIG. 8. Therefore, the converted data Da may be determined by the following equation:

$$Da = \frac{F_M - F_L}{F_H - F_L} \times (2^n - 1) \quad (5)$$

$$= \frac{M/T_2}{N/T_1} \times (2^n - 1)$$

Where a time $T_1$ is so controlled as to provide $N = (2^n - 1)$ and a time $T_2$ is so controlled as to give $T_1 = T_2$, then the above equation (5) may be rewritten as Da = M. Accordingly, a value still remaining in the up-down counter 50 after supply of a voltage signal being measured represents converted data itself.

Figure 6:
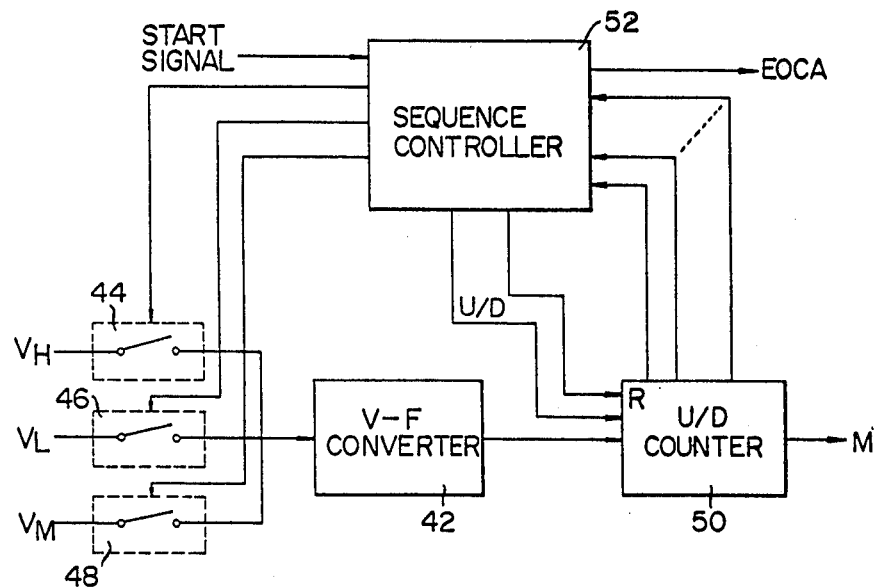
FIG. 6 is a block circuit diagram of an analog-digital converter according to another embodiment of the invention.
Figure 7:
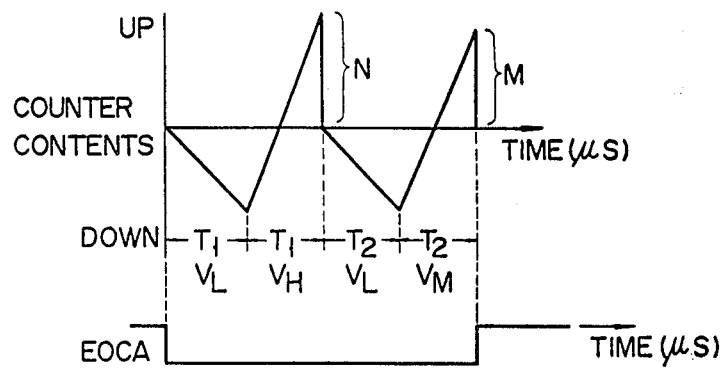
FIG. 7 illustrates the contents of a counter included in the A-D converter of FIG. 6.

With the measuring method of FIGS. 6 and 7, the down-counting step for measurement of the first referential analog voltage signal preceded the up-counting step for measurement of the second referential analog voltage signal. However, reversal of the order of said counting modes still gives the same effect.

The A-D converter according to the embodiment described by reference to FIGS. 6 and 7 can give error-free converted data, provided the V-F characteristic curves of the V-F converter have a straight form, even though they do not pass through the zero point, or vary in graduation by changes in external factors such as ambient temperature and power source voltage.

With the embodiment of FIGS. 6 and 7, the time $T_2$ was so controlled as to be equal to the time $T_1$. However, the time $T_2$ may have a value determinable by the aforesaid equation (2).

$$T_2 = T_1 \times \frac{2^n - 1}{N}$$

In this case, converted data Da is determined by the previously described equation (3).

$$Da = \frac{M}{T_1 \times \frac{2^n - 1}{N}} \times (2^n - 1) = M$$

Where the time $T_2$ is so controlled as to have a value determinable by the above equation (3), it is possible to use the correction cycle $T_1$ immediately before the measurement cycle, thereby enabling A-D conversion to be effected with higher precision.

Figure 9:
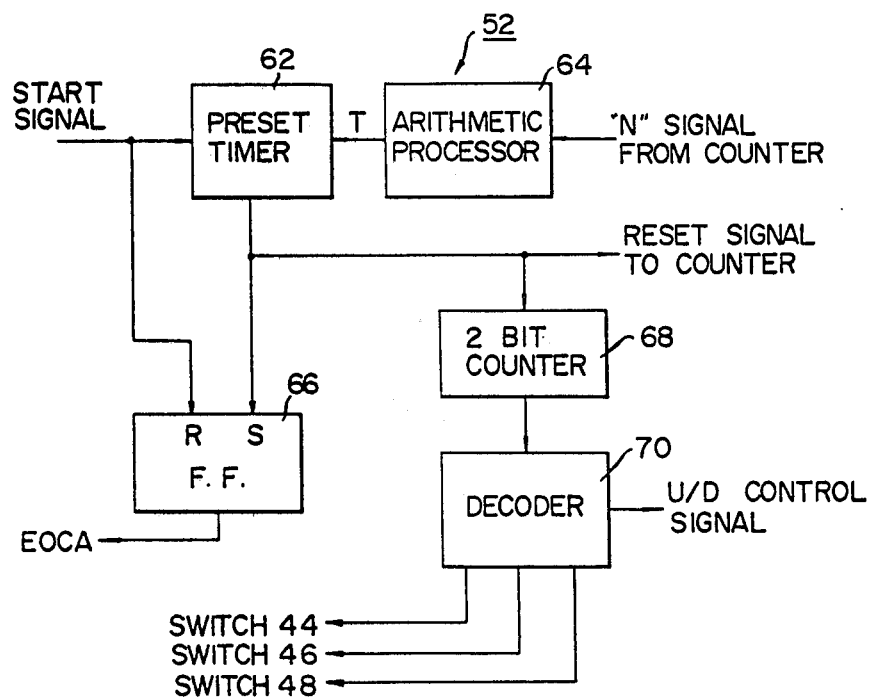
FIG. 9 is a block circuit diagram of a sequence controller included in FIG. 6.

FIG. 9 is a block circuit diagram of the controller 52 shown in FIG. 6. A processor 64 figures out the counting time of the up-down counter 50 when the processor 64 is supplied with output bit signals from the up-down counter 50. A preset timer 62 is operated by a start signal and set at a prescribed length of time by an output signal from the processor 64, and produces an output signal to reset the counter 50. A flip-flop circuit 66 receives an output signal from the timer 62 at the set terminal S and the start signal at the reset terminal R. The binary mode of the flip-flop circuit 66 is reversed by the start signal or an output pulse signal from the timer 62. The flip-flop circuit 66 produces an EOCA signal. A 2-bit counter 68 counts up output pulse signals delivered from the timer 62. A decoder 70 receives an output signal from the 2-bit counter 68. The decoder 70 decodes the output signal from the 2-bit counter 68, generates control signals to control the operation of the switches 44, 46, 48 and sends forth a counting mode-specifying signal to control the counting mode of the up-down counter 50. A timer 62 is preset at a prescribed length of time $T_1$ or $T_2$ by a processor 64. The processor 64 carries out arithmetic operation on input data to control the prescribed length of time $T_1$ or $T_2$ to a value expressed as follows:

$$T_1(i) = T_1(i - 1) \times \frac{2^n - 1}{N(i - 1)}$$

$$T_2(i) = T_1 \times \frac{2^n - 1}{N(i)}$$

FIG. 10 shows waveforms of signals at various points of the block circuit diagram of FIG. 6 and the contents of the counter included therein.

There will now be described by reference to FIG. 11 an A-D converter according to still another embodiment of this invention. This embodiment can shorten a length of time required to obtain converted data. The parts of FIG. 11 the same as those of FIG. 6 are denoted by the same numerals, description thereof being omitted. The embodiment of FIG. 11 is characterized in that two up-down counters 50A, 50B are provided on the output side of the V-F converter 42.

As in the embodiment of FIG. 6, the switches 44, 46, 48 are successively closed by the sequence voltage $V_L$ and voltage $V_M$ being measured are converted by the V-F converter 42 into pulse signals having a frequency corresponding to the respective levels of voltage. The characteristic of the embodiment of FIG. 11 is that pulse signals are counted by the counter 50A when the high level referential voltage $V_H$ is received; pulse signals are counted by the counter 50B when the voltage $V_M$ being measured is impressed; and pulse signals are counted by both counters 50A, 50B when the low level voltage $V_L$ is applied. The sequence controller 52 selectively designates the counter which should commence counting.

There will now be described by reference to FIG. 12 the operation of the A-D converter according to the embodiment of FIG. 11. Now let it be assumed that the switch 44 is rendered conducting for a time $T_1$ and both counters 50A, 50B are set for down-counting. When the low level referential voltage $V_L$ is supplied, output pulse signals from the V-F converter 42 are counted down by both counters 50A, 50B. After a time $T_1$, the contents of the counters 50A, 50B indicate $(-F_L \times T_1)$ alike. Where the switch 44 is rendered nonconducting and the switch 46 is operated for a time $T_1$, then the counter 50A is selected and begins up-counting. The counter 50A counts up pulse signals delivered from the V-F converter 42 when the high level referential voltage $V_H$ is supplied. After a time $T_1$, the contents of the converter 50A indicate $(F_H - F_L) \times T_1$. During this time $T_1$, the counter 50B remains inoperative, with the contents thereof kept at $(-F_L \times T_1)$. When the switch 46 is rendered nonconducting and the switch 48 is closed, then the counter 50B is selected as the unit which should commence counting. At this time the counter 50B is arranged for up-counting, and counts up output pulse signals issued from the V-F converter 42 when a voltage $V_M$ being measured is supplied. During the time $T_1$, the counter 50A remains inoperative with the contents left unchanged. After the time $T_1$, the counter 50B indicates contents expressed as $(F_M - F_L) \times T_1$. At this time, converted data Da is determined by the following equation:

$$Da = \frac{F_M - F_L}{F_H - F_L} \times (2^n - 1)$$

Where the time $T_1$ is so controlled as to provide $N = (2^n - 1)$, then the converted data Da is expressed as follows Da = M In this case, an output signal itself from the counter 50B represents converted data Da.

With the embodiment of FIG. 11, a number of down-counting operations is decreased by one as compared with the embodiment of FIG. 6, thereby shortening a length of time required to obtain converted data.

There will now be described by reference to FIG. 13 an A-D converter according to a further embodiment which, like the embodiment of FIG. 11, can decrease a length of time required to obtain converted data. With the embodiment of FIG. 13, an up-down preset counter 50 provided on the output side of the V-F converter 42 is of the preset type. A register 54 is further provided to store the contents of said up-down counter 50. A transfer instruction issued from the sequence controller 52 causes the contents of the up-down counter 50 to be transferred between said counter 50 and register 54.

There will now be described the operation of the embodiment of FIG. 13 by reference to the counter contents of FIG. 14. First, the switch 46 is closed for a time $T_1$ and the up-down counter 50 is set for down-counting by the sequence controller 52. After the time $T_1$, the up-down counter 50 shows contents expressed as $(-F_L \times T_1)$. After said time $T_1$, the contents are stored in the register 54 upon receipt of a transfer instruction from the sequence controller 52. At this time, the switch 46 is rendered nonconducting and the switch 44 is put into operation. The up-down counter 50 is arranged for up-counting. After the time $T_1$, the up-down counter 50 indicates contents expressed as $(F_H - F_L) \times T_1$. The contents are taken to be N. Thereafter, the up-down counter 50 is cleared of the contents. The data stored in the register 54 is transferred to the up-down counter 50. For the time $T_1$, the switch 44 is rendered nonconducting and the switch 46 is put into operation. The up-down counter 50 is set for up-counting. After the time $T_1$, the up-down counter 50 indicates contents expressed as $(F_M - F_L) \times T_1$. Said contents themselves constitute converted data. With the embodiment of FIGS. 13 and 14, too, a number of down-counting operations is decreased by one as compared with the embodiment of FIG. 6, thereby shortening a length of time required to obtain converted data.

The A-D converter of FIG. 13 enables converted data to be given more quickly as described below by reference to the counter contents of FIGS. 15 and 16. FIG. 15 shows the correction cycle of the V-F converter 42. FIG. 16 indicates the measurement cycle of the V-F converter 42. For a time $T_{i-1}$, the switch 46 is rendered conducting, and the up-down counter 50 is specified for down-counting. After the time $T_{i-1}$, the up-down counter 50 shows contents expressed as $(-F_L \times T_{i-1})$. Upon receipt of a transfer instruction from the sequence controller 52, said contents are transferred to the register 54. At this time, the switch 46 is rendered inoperative, and the switch 44 is operated for the time $T_{i-1}$. The up-down counter 50 is arranged for up-counting. After the time $T_{i-1}$, the up-down counter 50 gives the contents expressed as $(F_H - F_L) \times T_{i-1}$. Upon receipt of a control signal from the sequence controller 52, the up-down counter 50 is cleared of the contents, and set for down-counting. At this time, the switch 44 is rendered inoperative, and the switch 46 is put into operation for the time $T_i$. After the time $T_i$, the contents of the up-down counter 50 indicate $(-F_L \times T_i)$. Upon receipt of a transfer instruction from the sequence controlling 52, said contents are conducted to the register 54. At this time, the switch 46 is rendered nonconducting, and the switch 44 is operated for the time $T_i$. The up-down counter 50 is arranged for up-counting. After the time $T_i$, the up-down counter 50 shows contents expressed as $(F_H - F_L) \times T_i$. Upon receipt of a control signal from the sequence controller 52, said contents are cleared, and the up-down counter 50 is set for down-counting. At this time the switch 44 is rendered nonconducting and the switch 46 is put into operation for a time $T_{i+1}$. As mentioned above, the contents of the up-down counter 50 are repeatedly conducted to the register 54, when the low level referential voltage is impressed. When high level voltage $V_H$ is applied during the above-mentioned repeated cycles, then a time $T_j (j = i-1, i, i+1 \ldots)$ is so controlled as to cause the result $N_i$ of counting by the up-down counter 50 to indicate $N_i = (2^n - 1)$. The time $T_j$ is expressed by the following equation:

$$T_j = T_{i-1} \times \frac{(2^n - 1)}{N_{i-1}}$$

Under the condition where the time $T_j$ is so controlled as indicate $N_i = (2^n - 1)$, let it be assumed that at time $t_1$, an A-D conversion-starting instruction shown in FIG. 16 has been issued from the sequence controller 52. Then the switch 48 is rendered conducting for the time $T_i$, causing voltage $V_M$ being measured to be impressed. At this time, the updown counter 50 is already supplied with the contents of the register 54 and arranged for up-counting. Therefore, said up-down counter 50 continues up-counting for a time T so controlled as to result in $N_i = (2^n - 1)$, starting with the contents stored in the register 54. After the time T, the contents themselves of the up-down counter 50 represent converted data.

According to this embodiment, the waiting cycle is always kept going.

Where, therefore, it is intermittently demanded to obtain converted data, the process described by reference to FIGS. 13, 15 and 16 eliminates the necessity of starting any waiting cycle afresh each time demanded. Namely, said process makes it suffice only of one proper A-D conversion cycle is applied whenever need arises.

Consequently, the embodiment of FIGS. 13, 15 and 16 decreases a converted data-obtaining time to one-third of what is realized by the embodiment of FIGS. 11 and 12 or the embodiment of FIGS. 11, 13 and 14. FIG. 17 is a block circuit diagram of an A-D converter wherein the operation of the counter 10 and switches 44, 46, 48 is controlled by a central processor unit (hereinafter referred as to "CPU") 82. The parts of FIG. 17 the same as those of the embodiments of FIGS. 2, 6, 11, and 13 and denoted by the same numerals, description thereof being omitted. With the embodiment of FIG. 17, an output signal from the V-F converter 42 is conducted to a counter 10 through a switch 84. An output signal from the counter 10 is supplied to a bus driver 86 to be amplified thereby. An output signal from the bus driver 86 is delivered to the CPU 82. This CPU 82 processes a signal or data supplied from the bus driver 86, supplies signals to control the operation of the switches 44, 46, 48, and also sends forth a control signal by which a timer 88 is set at a prescribed length of time. The timer 88 continues to issue a signal to actuate the switch 84 for a prescribed length of time at which said timer 88 is preset. The CPU 82 further sends forth a read/clear (R/C) instruction to the counter 10 and bus driver 86. Upon receipt of said R/C instruction, the bus driver 86 reads data out of the counter 10 and transfers the data to the CPU 82. Upon receipt of said R/C instruction, the counter 10 is cleared of the contents. When the CPU 82 issues a R/C instruction, then the timer 88 ceases and sends forth a signal to the switch 84, which in turn is left nonconducting.

Data is converted through the undermentioned steps. The switches 44, 84 are closed for a prescribed length of time T at which the timer 88 is preset. The counter 10 counts pulse signals having a frequency corresponding to the voltage level of a second referential analog voltage signal $V_H$ received. Upon receipt of a R/C instruction from the CPU 82, the counter 10 is cleared of its contents. At this time, the counter 10 has contents expressed as $N_H$. When the switches 46, 84 are closed, a first referential analog voltage signal $V_L$ is supplied. Pulse signals having a frequency corresponding to the voltage level of said first referential analog voltage signal are counted by the counter 10 for the prescribed length of time T. Similarly upon receipt of a R/C instruction from the CPU 82, the counter 10 is cleared of its contents. At this time, the counter 10 has contents indicated as $N_L$. Thereafter, the switches 48, 84 are closed for the prescribed length of time T, causing an analog input voltage signal $V_M$ being measured to be supplied. The counter 10 counts pulse signals having a frequency corresponding to the voltage level of said analog input voltage signal $V_M$. After the prescribed length of time T, the counter 10 has contents expressed as $N_M$. The CPU 82 carries out the undermentioned arithmetic operation to provide converted data, with the counting time of the counter 10 set at, for example, 1 microsecond.

$$Da = \frac{N_M - N_L}{N_H - N_L} \times (2^n - 1)$$

Where the counting time of the counter 10 is so controlled as to indicate $N_H - N_L = 2^n - 1$, namely $$T_{(i)} = T_{(i-1)} \times \frac{2^n - 1}{N_H - N_L},$$

then converted data is obtained from the following equation:

$$Da \approx N_M - N_L$$

FIG. 18 is a waveform diagram of signals generated at the various sections of the A-D converter according to the embodiment of FIG. 17.

What is claimed is:

1. An analog-to-digital conversion method using a voltage-to-frequency converter comprising the steps of:
    counting for a first time period in a first counting device set to a first counting mode first pulse signals having a frequency corresponding to a voltage level of a first reference input signal to generate a first count defining a reference point on a voltage-to-frequency characteristic curve of the voltage-to-frequency converter;
    setting a second counting device to the first count at the end of the first time period;
    counting for a second time period in the second counting device set to a second counting mode second pulse signals having a frequency corresponding to a voltage level of a second reference input signal to generate a second count defining a graduation point of the voltage-to-frequency characteristic curve;
    counting for a third time period in the first counting device set to the first count and to the second counting mode third pulse signals having a frequency corresponding to an analog input signal to generate a third count; and
    determining the voltage level of the analog input signal from the second count and the third count.

2. The A-D conversion method according to claim 1, wherein the first counting mode is of the down-counting type, and the second counting mode is of the up-counting type.

3. The A-D conversion method according to claim 1, wherein the first counting mode is of the up-counting type, and the second counting mode is of the down-counting type.

* * * * *